United States Patent [19]

Huemmer et al.

[11] 4,281,152
[45] Jul. 28, 1981

[54] ACRYLATE MONOMERS AND PHOTOPOLYMERIZABLE COMPOSITIONS CONTAINING SAME

[75] Inventors: Thomas F. Huemmer; Pallavoor R. Lakshmanan, both of Houston, Tex.

[73] Assignee: Gulf Oil Corporation, Pittsburgh, Pa.

[21] Appl. No.: 161,638

[22] Filed: Jun. 20, 1980

[51] Int. Cl.³ .......................................... C07C 69/767
[52] U.S. Cl. .................................... 560/52; 526/313; 526/316; 204/159.22
[58] Field of Search ......................................... 560/52

[56] References Cited

U.S. PATENT DOCUMENTS

| 3,451,980 | 6/1969 | Brownstein | 560/90 |
| 3,595,969 | 7/1971 | Sheperd et al. | 560/52 |
| 4,022,674 | 5/1977 | Rosen | 560/52 |
| 4,139,577 | 2/1979 | Kuehn | 525/444 |
| 4,198,520 | 4/1980 | Samour et al. | 560/90 |

Primary Examiner—Jane S. Myers
Attorney, Agent, or Firm—Richard L. Kelly

[57] ABSTRACT

Acrylate monomers useful as a component of U.V. curable resin compositions and anaerobic adhesive compositions are provided and have the structure:

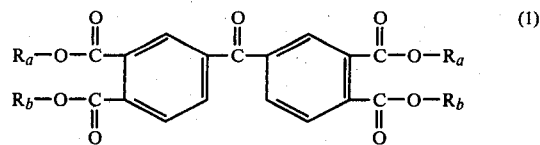

(1)

where $R_a$ is an alkyl group containing up to about 18 carbon atoms, or an alkoxy ether moiety having the structure:

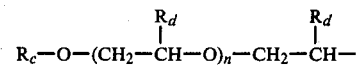

where $R_c$ is an alkyl group containing up to about 18 carbon atoms, $R_d$ is hydrogen or a methyl group, and n is zero or a small integer, and $R_b$ has the structure:

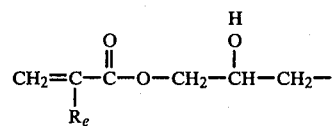

or

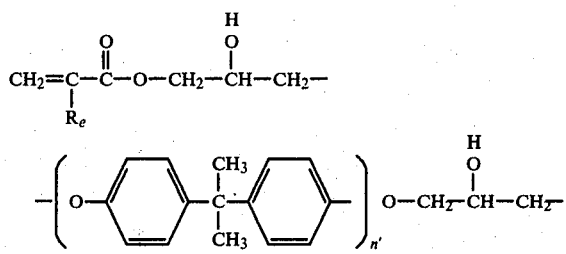

where $R_e$ is hydrogen or an alkyl group and n' is a small integer.

4 Claims, No Drawings

ACRYLATE MONOMERS AND PHOTOPOLYMERIZABLE COMPOSITIONS CONTAINING SAME

BACKGROUND OF THE INVENTION

Photopolymerizable compositions and anaerobic adhesives have certain common characteristics. With each type of composition, the film-forming components comprise essentially the total composition, except for small quantities of photoinitiators, free radical polymerization initiators, plasticizers, and the like. The compositions do not contain solvents that need to be removed from the films or coatings prepared therefrom.

While there are numerous photopolymerizable and anaerobic adhesive compositions available to the art, the art is constantly seeking monomeric materials for inclusion in such compositions which will improve their performance properties. It is a principal object of the present invention to provide such improved monomeric materials.

CROSS REFERENCE TO RELATED APPLICATION

The novel monomers disclosed and claimed herein are included as an essential component in the anaerobic adhesive compositions disclosed and claimed in the applicants' copending application, Ser. No. 161,728, filed of even date herewith.

SUMMARY OF THE INVENTION

The applicants have invented certain acrylate monomers having the structure:

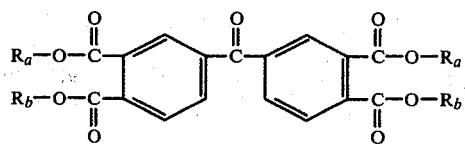

where $R_a$ is an alkyl group containing up to about 18 carbon atoms, or an alkoxy ether moiety having the structure:

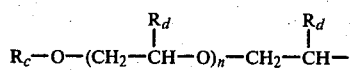

where $R_c$ is an alkyl group containing up to about 18 carbon atoms, $R_d$ is hydrogen or a methyl group, and n is zero or a small integer, and $R_b$ has the structure:

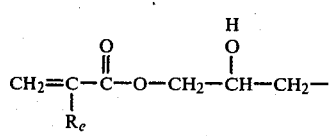

or

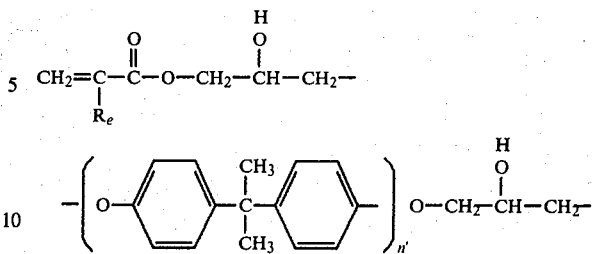

where $R_e$ is hydrogen or an alkyl group and n' is a small integer.

DETAILED DESCRIPTION OF THE INVENTION

The compounds of formula (1) are prepared by a two step process. In the first step, two (2) mols of a suitable alcohol are reacted with one (1) mol of 3,4,3',4' benzophenone tetracarboxylic acid dianhydride (BTDA) to provide a diester having the formula:

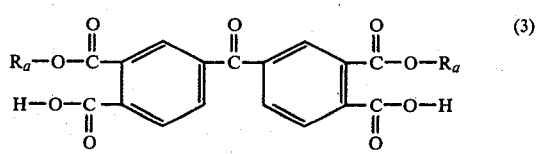

This reaction proceeds readily in a suitable solvent at mild temperatures and in the absence of catalysts. By way of example, the alcohol and the BTDA are added to a solvent such as toluene and heated to temperatures of the order of 120° C. Depending upon the quantity of the solvent employed, all of the BTDA may not go into solution immediately. However, as the BTDA in solution is esterified, more undissolved BTDA goes into solution and this action continues until all of the BTDA has dissolved and has been esterified. The progress of the reaction can be determined by measuring the infrared spectrum of an aliquot of the reaction mixture to determine the concentration of anhydride groups therein.

In the second step of the process, one (1) mol of the diester product of formula (3) is reacted with two (2) mols of either a glycidyl ester of an acrylic acid, such as acrylic acid itself, or an alkacrylic acid such as methacrylic acid, or (b) a half acrylate ester of an epoxy resin prepared from bisphenol-A and epichlorohydrin. When the final product of formula (1) is prepared from the glycidyl ester of an acrylic acid, and $R_b$ groups of formula (1) will have the structure:

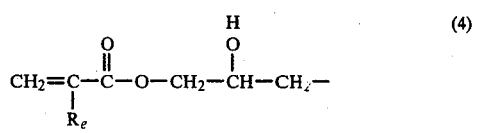

When the final product of formula (1) is prepared from a half acrylate ester of the epoxy resin prepared from bisphenol-A and epichlorohydrin, the $R_b$ groups of formula (1) will have the structure:

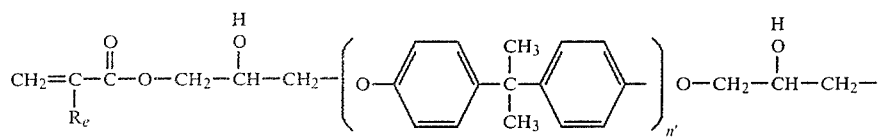

The second step of the process is readily carried out by simply charging the requisite quantity of the glycidyl ester of the acrylic acid (or alternatively the half acrylate ester of the epoxy resin) to a solvent solution of the diester prepared in the first step of the process. The reaction is run in the presence of a catalyst, preferably a quaternary ammonium compound, at mild temperatures of less than 100° C. The progress of the reaction can be followed by determining the acid number of the reaction medium.

The alcohol employed to esterify the BTDA in the first step of the process is not critical for most purposes. Alkanols containing up to about 18 carbon atoms can be employed. When it is desired to introduce into the monomer an alkoxy either moiety of the structure of formula (2), the BTDA should be esterified with an alkyl ether of a glycol or a polyglycol such as the methyl, ethyl and butyl ethers of ethylene glycol, propylene glycol, diethylene glycol, and the like. Many such ether glycols are commercially available under the trade designation Carbitol*. It has been noted that the acrylate monomers of formula (1) which bear the alkoxy ether moiety shown in formula (2) have special utility when included in photopolymerizable compositions. Specifically, the monomers containing such an alkoxy ether moiety tend to cure with little or no added photoinitiator.

*Carbitol is a trade name of the Union Carbide Corporation

In preparing photopolymerizable compositions containing an acrylate monomer of the invention, the acrylate monomer will be blended with one or more additional polymerizable ethylenically unsaturated compounds of the type employed in the photoinitiated coating compositions reported in the prior art. Typically, these materials will be complex esters or ethers containing two or more vinyl or allyl groups such as diallyl phthalate, diallyl maleate, diallyl fumarate, triallyl cyanaurate, triallyl phosphate, ethylene glycol dimethacrylate, glycerol trimethacrylate, pentaerythritol triacrylate, methacrylic acid anhydride, and allyl ethers of polyhydroxy compounds such as ethylene glycol diallyl ether, pentaerythritol tetrallyl ether, and the like. Non-terminally unsaturated compounds such as diethyl fumarate can similarly be used. Many proprietary resins containing terminal allyl and acrylate groups are commercially available and can be employed. Many of these resins are modified urethane and epoxy resins. The novel acrylate monomer of the present invention should constitute at least 10 weight %, preferably 20-80 and more especially 20-40 weight % of the total monomers included in the photopolymerizable compositions.

An interesting and desirable characteristic of photopolymerizable compositions containing the acrylate monomers of the invention is that they can be cured by UV light without requiring the addition of photoinitiators. The phenomenon is shown by the data of Example 2, infra. If desired for special purposes or even faster curing, however, the photopolymerizable compositions of the invention also may be formulated to include photoinitiating compounds of the type commonly employed in the art, including the benzoin ethers, the benzophenone compounds, Michler's ketone, xanthone derivatives, acetophenones, and the like. The compositions also can be formulated to include amine synergists such as methyl diethanolamine.

The anaerobic adhesive compositions of the invention will be essentially similar to the photopolymerizable compositions described above. The anaerobic adhesive will differ therefrom in not containing a photoinitiator and in including in the composition one or more free radical polymerization initiators such as cumene hydroperoxide or t-butyl hydroxide. Frequently minor components of other materials are included as accelerators such as dimethyltoluidine and saccharin.

The following examples are set forth to illustrate more clearly the principle and practice of the invention to those skilled in the art. Where parts and/or percentages are set forth, they are parts or percentages on a weight basis unless otherwise specified.

EXAMPLE 1

Part A

A round bottom flask equipped with a stirrer, reflux condenser, and thermometer was charged with 181 grams (0.56 mol) of BTDA, 182 grams (1.12 mol) of butyl Carbitol and 194 grams of toluene. The mixture was heated to 120° C. and maintained at this temperature overnight. An infrared spectrum of the product indicated that only trace quantities of BTDA remained in the reaction mixture.

Part B

The apparatus described in Part A was modified by adding a tube to bubble air through the flask's contents and by adding a dropping funnel. To the contents described in Part A were added 8 grams of trimethyl benzyl ammonium chloride and 0.05 gram of p-methoxyphenol (added as a polymerization inhibitor). The reaction mixture was heated to 70° C. and 160 grams (1.12 mol) of glycidyl methacrylate was added to the reaction mixture over a period of 0.5 hour. Heating was continued for another 10 hours at 75° C., or until a titration of the reaction mixture showed that essentially all of the carboxyl groups have reacted. A slow stream of air was bubbled through the reaction mixture to inhibit polymerization of the acrylate groups.

EXAMPLE 2

Several photopolymerizable compositions were prepared as shown in Table I.

TABLE I

| Component | Composition | | | | |
|---|---|---|---|---|---|
| | A | B | C | D | E |
| Proprietary Resin A (1) | 50 | — | 25 | 25 | 25 |
| Proprietary Resin B (2) | — | 50 | 50 | 25 | 25 |
| TMPTA (3) | — | — | — | 25 | — |
| HDDA (4) | — | — | — | — | 25 |

TABLE I-continued

| Component | Composition | | | | |
|---|---|---|---|---|---|
| | A | B | C | D | E |
| Monomer of Example 1 | 50 | 50 | 25 | 25 | 25 |

(1) Resin containing 0.375 equivalents of acrylic acid per 100 grams of resin and prepared by reacting acrylic acid with epoxidized soybean oil.
(2) Resin containing 0.18 equivalents of acrylic acid per 100 grams of resin and being an acrylate terminated urethane prepolymer.
(3) Trimethylol propane triacrylate.
(4) Hexanediol-1,6 diacrylate Each of the above compositions, when coated onto Leneta charts as 0.5 mil coatings, can be cured to tack-free films in a QC Processor* at a line speed of 20 ft/min and a power density of 200 watts/inch.
*Model 1202 AN, supplied by P.P.G. Industries.

EXAMPLE 3

Several anaerobic adhesive compositions were prepared as shown in Table II.

TABLE II

| Component | Composition | | | |
|---|---|---|---|---|
| | A | B | C | D |
| VTBN (1) | 15 | 15 | 10 | 5 |
| TEGMA (2) | 10 | 10 | 10 | 10 |
| Monomer of Example 1 | 5 | 5 | 10 | 15 |
| t-BHP (3) | 0.75 | 1.25 | 0.75 | 0.75 |
| DMT (4) | 0.25 | 0.25 | 0.25 | 0.25 |

(1) Vinyl terminated butadiene polymer.
(2) Tetraethylene glycol diacrylate.
(3) t-butyl hydroperoxide.
(4) Dimethyl toluidine.

Each of the compositions, when used to bond steel plates together and aged for 24 hours at ambient temperature, provided lap bond strengths in excess of 200 psi.

What is claimed is:

1. A copolymerizable acrylate monomer useful as a component of U.V. curable resin compositions and anaerobic adhesive compositions with the structure:

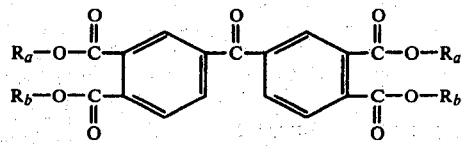
(1)

where $R_a$ is an alkyl group containing up to about 18 carbon atoms or an alkoxy ether moiety having the structure:

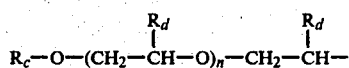

where $R_c$ is an alkyl group containing up to about 18 carbon atoms, $R_d$ is hydrogen or a methyl group, and n is zero or a small integer, and $R_b$ has the structure:

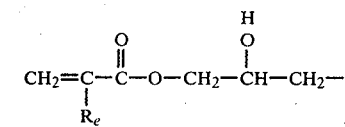

or

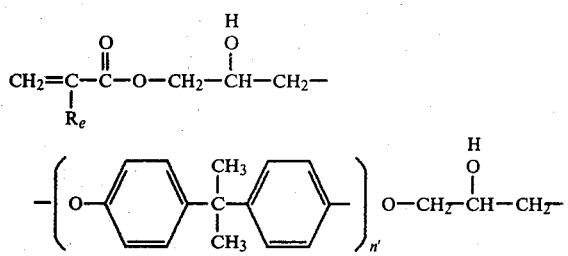

where $R_e$ is hydrogen or an alkyl group and n' is a small integer.

2. An acrylate monomer of claim 1 in which $R_a$ has the structure:

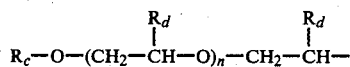

where $R_c$ is an alkyl group containing up to about 18 carbon atoms, $R_d$ is hydrogen or a methyl group, and n is zero or a small integer.

3. An acrylate monomer of claim 1 or 2 in which $R_b$ has the structure:

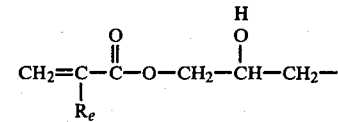

where $R_e$ is hydrogen or an alkyl group.

4. An acrylate monomer of claim 1 or 2 in which $R_b$ has the structure:

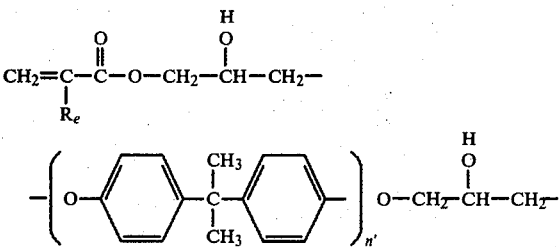

where $R_e$ is hydrogen or an alkly group and n' is a small integer.

* * * * *